United States Patent [19]
Werrbach

US005737432A

[11] Patent Number: 5,737,432
[45] Date of Patent: Apr. 7, 1998

[54] SPLIT-BAND CLIPPER

[75] Inventor: Donn R. Werrbach, Glendale, Calif.

[73] Assignee: Aphex Systems, Ltd., Sun Valley, Calif.

[21] Appl. No.: 751,411

[22] Filed: Nov. 18, 1996

[51] Int. Cl.$^6$ .................................................. H04B 15/00
[52] U.S. Cl. ........................... 381/94; 381/107; 381/100
[58] Field of Search ........................ 381/94, 104, 106, 381/107, 108, 100; 333/14

[56] References Cited

U.S. PATENT DOCUMENTS

| | | | |
|---|---|---|---|
| 4,207,526 | 6/1980 | Abt | 381/107 |
| 4,208,548 | 6/1980 | Orban . | |
| 4,241,266 | 12/1980 | Orban . | |
| 4,412,100 | 10/1983 | Orban | 381/106 |
| 4,460,871 | 7/1984 | Orban . | |
| 4,525,857 | 7/1985 | Orban . | |
| 4,679,239 | 7/1987 | Jones | 381/16 |
| 4,737,725 | 4/1988 | Wood . | |
| 5,168,526 | 12/1992 | Orban . | |

*Primary Examiner*—Forester W. Isen
*Attorney, Agent, or Firm*—Thomas I. Rozsa; Tony D. Chen

[57] ABSTRACT

A split-band clipper which generates less distortion, minimizes or reduces the occurrence of all IMD, or at least will minimize and reduce the occurrence of widely space IMD, and reduce the quantity of harmonic distortion caused by clipping of bass frequencies. The split-band clipper has a crossover for splitting an input signal into a lowpass output signal and a highpass output signal; a variable clipping is coupled to the lowpass output of the crossover to output a variably clipped lowpass signal; a summing for adding together the highpass output of the crossover and the variably clipped output of the variable clipper and outputting a summed signal; a fixed clipper to clip the summed signal at a fixed threshold level; an intermodulation detector to measure or estimate the amount of high frequency clipping in the fixed clipper caused by presence of low frequencies; and the intermodulation detector coupled to the variable clipper to reduce the threshold of clipping of low frequencies by the variable clipper whenever high frequency clipping is detected in the fixed clipper as a result of the presence of low frequencies.

18 Claims, 11 Drawing Sheets

SPLIT-BAND CLIPPER

BACKGROUND OF THE INVENTION

1. Field of the Invention

The present invention generally relates to the field of signal processors. More particularly, the present invention relates to the field of signal clippers.

2. Description of the Prior Art

In the art of signal processing, clippers are frequently employed to limit the amplitude of a signal. The distortion caused by clipping is sometimes an acceptable tradeoff against the disadvantages of other forms of amplitude limiting such as automatic gain control (AGC) limiters. For example, clipping preserves a more continuous average signal level than AGC since AGC attenuates the whole signal waveform while clipping only cuts off the peaks above the clip threshold. It has therefore become a common practice to use audio signal clippers for limiting the peak modulation of a broadcast transmission. Such clipping does cause a certain amount of objectionable distortion but is employed in favor of AGC limiters to allow the maintenance of higher average modulation. It would be advantageous, however, to create a clipper that generates less distortion.

A common distortion caused by audio signal clipping is intermodulation distortion (hereafter referred as "IMD"). IMD can be classified as closely spaced intermodulation and widely spaced intermodulation. Closely spaced intermodulation occurs when frequencies close together in the spectrum clip at the same instances and create beat frequencies. Widely spaced intermodulation occurs when widely differing frequencies clip at the same instances.

Widely spaced IMD is frequently caused when bass frequencies of relatively large amplitude momentarily approach the clipper causing higher frequencies of relatively low amplitude to be "pinched off" during the time when the bass wave is near or into clipping. Closely spaced IMD is caused when signal components relatively close in frequency become clipped at the same time. The distortion products of closely spaced IMD can, at least partly, be hidden by the ear's psycho acoustic response known as "the masking effect", while widely spaced IMD is usually not masked and relatively more audible in most circumstances. It would be advantageous to create a clipper which would minimize or reduce the occurrence of all IMD, or at least minimize and reduce the occurrence of widely spaced IMD.

Harmonic distortion is also a consequence of clipping a signal. In audio waveforms, the amplitude is usually highest for bass frequencies, and consequently the most likely frequencies to cause clipping are the bass frequencies. It would be advantageous to create a clipper which would reduce the quantity of harmonic distortion caused by clipping of bass frequencies.

The following four (4) prior art patents were uncovered in the pertinent field of the present invention:

1. U.S. Pat. No. 4,208,548 issued to Orban on Jun. 17, 1980 for "Apparatus And Method For Peak-Limiting Audio Frequency Signals" (hereafter "the '548 Orban Patent");
2. U.S. Pat. No. 4,241,266 issued to Orban on Dec. 23, 1980 for "Peak Limiting Apparatus For Audio Signal" (hereafter "the '266 Orban Patent");
3. U.S. Pat. No. 4,525,857 issued to Orban on Jun. 25, 1985 for "Crossover Network" (hereafter "the '857 Orban Patent"); and
4. U.S. Pat. No. 5, 168,526 issued to Orban on Dec. 1, 1992 for "Distortion-Cancellation Circuit For Audio Peak Limiting" (hereafter "the '526 Orban Patent").

The '548 Orban Patent discloses an apparatus and method for peak limiting audio frequency signals. The apparatus and method is used in systems employing high frequency pre-emphasis to compensate for steep high rolloff in a receiver. The apparatus and method is useful in standard AM broadcasting to maximize loudness without noticeable distortion. The distortion is caused by a clipper which is determined by subtracting a clipper's output from its input.

The '266 Orban Patent discloses a peak-limiting apparatus for an audio signal. It provides a control signal to dynamically adjust the level of clipping for an audio signal. A frequency weighted correlation is performed on the audio signal. If the audio signal is found to be highly periodic and correlated, that is, having future values predictable with high probability given knowledge of past values, less clipping is permitted since the clipping of such waveforms are more noticeable. If the evaluation of the audio waveform indicates that the signal is highly uncorrelated such as with bright symphonic music, more clipping is permitted.

The '857 Orban Patent discloses a crossover network. It comprises a first shelving filter, a second shelving filter, a first lowpass filter, a second lowpass filter, a phase corrector and a subtracting means. The first shelving filter receives an audio signal. The second shelving filter is coupled to the output of the first shelving filter. The first lowpass filter is coupled to the output of the first shelving filter. The second lowpass filter and the phase corrector are coupled to the output of the second shelving filter. The subtracting means is used for subtracting two signals coupled to the output of the first and second lowpass filters, and the phase corrector. The band limited crossover network is produced with a high frequency band which is present at the output of the subtraction means and a low frequency band is present at the output of the first lowpass filter.

The '526 Orban Patent discloses a distortion-cancellation circuit for an audio peak limiting. It reduces distortion in a peak limited audio signal. The amount of low-frequency spectral energy in the input signal is determined for a peak limited signal and used to control low-frequencies in the output audio signal.

None of these prior art patents have disclosed a split-band clipper which is designed to generate less distortion, minimize or reduce the occurrence of all IMD, or at least minimize and reduce the occurrence of widely spaced IMD, and reduce the quantity of harmonic distortion caused by clipping of bass frequencies. Therefore, it is desirable to provide a split-band clipper which eliminates the above mentioned items.

SUMMARY OF THE INVENTION

The present invention is a split-band clipper which generates less distortion, minimizes or reduces the occurrence of all IMD, or at least minimizes and reduces the occurrence of widely spaced IMD, and reduces the quantity of harmonic distortion caused by clipping of bass frequencies.

It is an object of the present invention to provide a split-band clipper which can reduce distortion.

It is an additional object of the present invention to provide a split-band clipper which minimizes or reduces the occurrence of all IMD, or at least will minimize and reduce the widely spaced IMD caused by the clipping.

It is a further object of the present invention to provide a split-band clipper which minimizes or reduces the percentage of harmonic distortion of bass frequencies caused by the clipping.

In the preferred embodiment of the present invention, the split-band clipper comprises a crossover means for splitting an input signal into a lowpass output signal and a highpass output signal, a variable clipping means for receiving the lowpass output signal from the crossover means and producing a variably clipped lowpass output signal, a summing means for receiving and adding together the highpass output signal from the crossover means and the variably clipped output signal from the variable clipping means and producing a summed output signal, a fixed clipper means to clip the summed signal at a fixed threshold level, and an intermodulation detector to measure or estimate the amount of high frequency clipping in the fixed clipper caused by the presence of low frequencies, where the intermodulation detector can be coupled to the variable clipping means to reduce the threshold of clipping of low frequencies by the variable clipping means whenever high frequency clipping is detected in the fixed clipper as a result of the presence of low frequencies.

Further novel features and other objects of the present invention will become apparent from the following detailed description, discussion and the appended claims, taken in conjunction with the drawings.

BRIEF DESCRIPTION OF THE DRAWINGS

Referring particularly to the drawings for the purpose of illustration only and not limitation, there is illustrated.

DESCRIPTION OF THE PREFERRED EMBODIMENT

Although specific embodiments of the present invention will now be described with reference to the drawings, it should be understood that such embodiments are by way of example only and merely illustrative of but a small number of the many possible specific embodiments which can represent applications of the principles of the present invention. Various changes and modifications obvious to one skilled in the art to which the present invention pertains are deemed to be within the spirit, scope and contemplation of the present invention as further defined in the appended claims.

Figure 1:
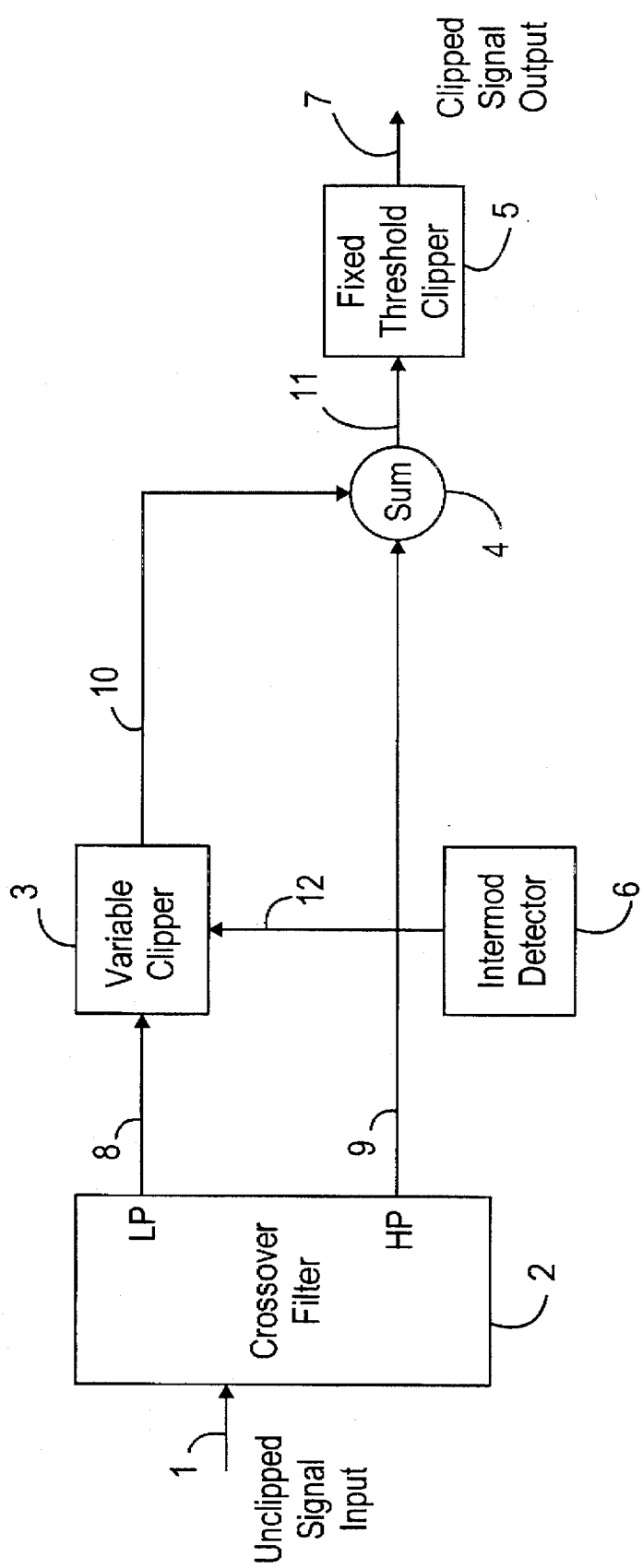
FIG. 1 is a block diagram of the present invention split-band clipper.

The present invention is a split-band clipper (hereinafter referred to as "SBC"). The essential parts of the SBC are illustrated in the block diagram of FIG. 1. Referring to FIG. 1, an unclipped input signal 1 is fed into the crossover filter 2 for the purpose of generating a lowpass output signal 8 and a highpass output signal 9. Without limiting the present invention, and for the purposes of illustration only, the crossover frequency may be approximately 300 Hz. The lowpass output signal 8 is coupled to the input of a variable clipper 3 for the purpose of clipping the lowpass signal 8 at a specified amplitude. The variable clipper 3 contains a clip threshold input coupled to a clip threshold signal 12 for the purpose of controlling the variable clipper 3 threshold of clipping. The output signal of variable clipper 3 is summed together with the highpass signal 9 by summing means 4. The output of summing means 4 comprises, therefore, a signal 11 containing all of the frequencies of input signal 1 and wherein the frequencies in the passband of the lowpass output 8 may be clipped at a variable threshold, and wherein the remaining higher frequencies are, as yet, unclipped. The summed signal 11 is coupled to the input of fixed threshold clipper 5 for the purpose of clipping all frequencies of signal 11 at a constant amplitude. By causing the variable clipper 3 to clip low frequencies at a lower amplitude than the clip threshold of fixed clipper 5, it can be seen that the clipping of relatively low amplitude high frequency waves riding atop high amplitude low frequency waves can often be averted if the low frequency clip threshold is reduced sufficiently and if the input signal amplitude 1 is adjusted so as to prevent excessive clipping by the fixed clipper 5.

The present invention SBC further comprises an intermodulation detector means 6 for the purpose of detecting the amount of high frequency clipping which is produced, or estimated to be produced, by fixed clipper 5 as a result of high amplitude low frequency waves present in the input signal 1. The intermodulation detector 6 is coupled to the variable clipper 3 by means of a control signal 12 for the purpose of allowing the intermodulation detector 6 to control the threshold of clipping of variable clipper 3. The operation of the crossover filter 2, intermodulation detector 6, variable clipper 3, summing means 4, and fixed clipper 5 which together create the SBC of the present invention will be described in detail as follows.

Referring to FIG. 1, an input signal 1 is coupled to the crossover filter 2, thus producing two frequency band outputs, the lowpass signal 8 and the highpass signal 9. The lowpass signal 8 is clipped by variable clipper 3 and summed with the highpass signal 9 by summing means 4 producing a summed output signal 11. The summed output signal 11 is clipped by fixed clipper 5 to produce the final output signal 7 of the present invention SBC. The intermodulation detector 6 appraises the amount of clipping by fixed clipper 5 of high frequency waves as a result of the amplitude of coexisting low frequency waves. Any such clipping is considered to be "low into high" intermodulation. If such described low into high intermodulation is detected, then the intermodulation detector 6, by means of the control signal 12, reduces the clip threshold of the variable clipper 3, causing the amplitude of low frequencies present in the fixed clipper 5 to be reduced accordingly. This continues until low into high intermodulation is no longer detected or until a practical low limit to the clip threshold is reached. At such a time as low into high intermodulation is no longer detected, the intermodulation detector 6 causes the clip threshold of variable clipper 3 to rise back up towards an upper threshold limit, thus allowing low frequency waves to occupy the full amplitude as defined by the clip threshold of the fixed clipper 5 whenever such a condition does not produce appreciable low into high intermodulation distortion.

Figure 2:
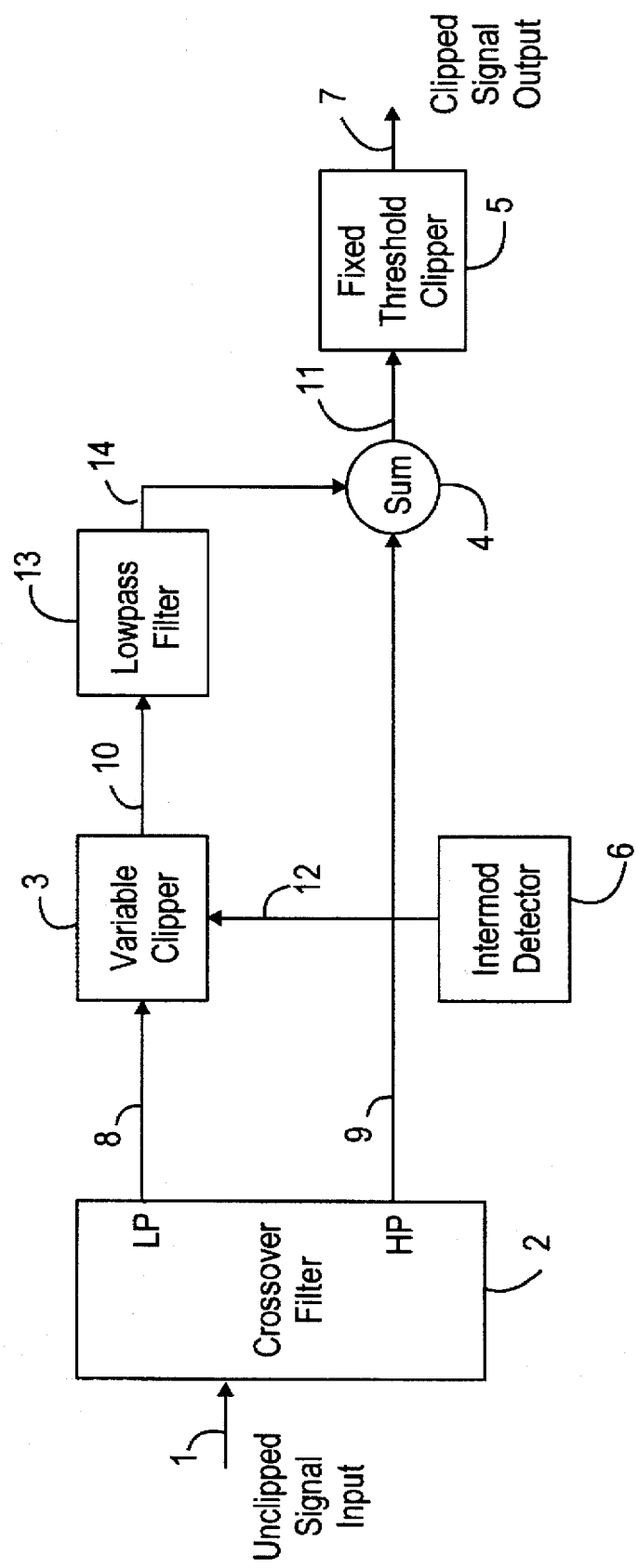
FIG. 2 is a block diagram of the present invention split-band clipper shown in FIG. 1, showing the improvement of the split-band clipper.

A further improvement to the present invention is illustrated by additional details shown in FIG. 2. Referring to FIG. 2, it can be seen that lowpass filter 13 has been added to the circuit of FIG. 1 for the purpose of reducing the harmonic distortion caused by the clipping of low frequencies by variable clipper 3. The addition of lowpass filter 13 changes the description of the present invention given in reference to FIG. 1 only as follows. The clipped low frequency output signal 10 is coupled to lowpass filter 13 for the purpose of removing many of the harmonics caused by clipping in the variable clipper 3. The output signal 14 of the lowpass filter 13 is summed together with the highpass signal 9 by summing means 4 thereby producing a summed signal 11 containing low frequencies which may be clipped with a portion of the clipping harmonics filtered out, and containing high frequencies which are as yet unclipped.

The preceding descriptions constitute the fundamental teachings and serve to illustrate the broader scope of the present invention SBC. Without limiting the present invention in any way, and for purposes of clarification only, additional details relating to the presently preferred embodiment of the present invention will now be described.

Figure 3:
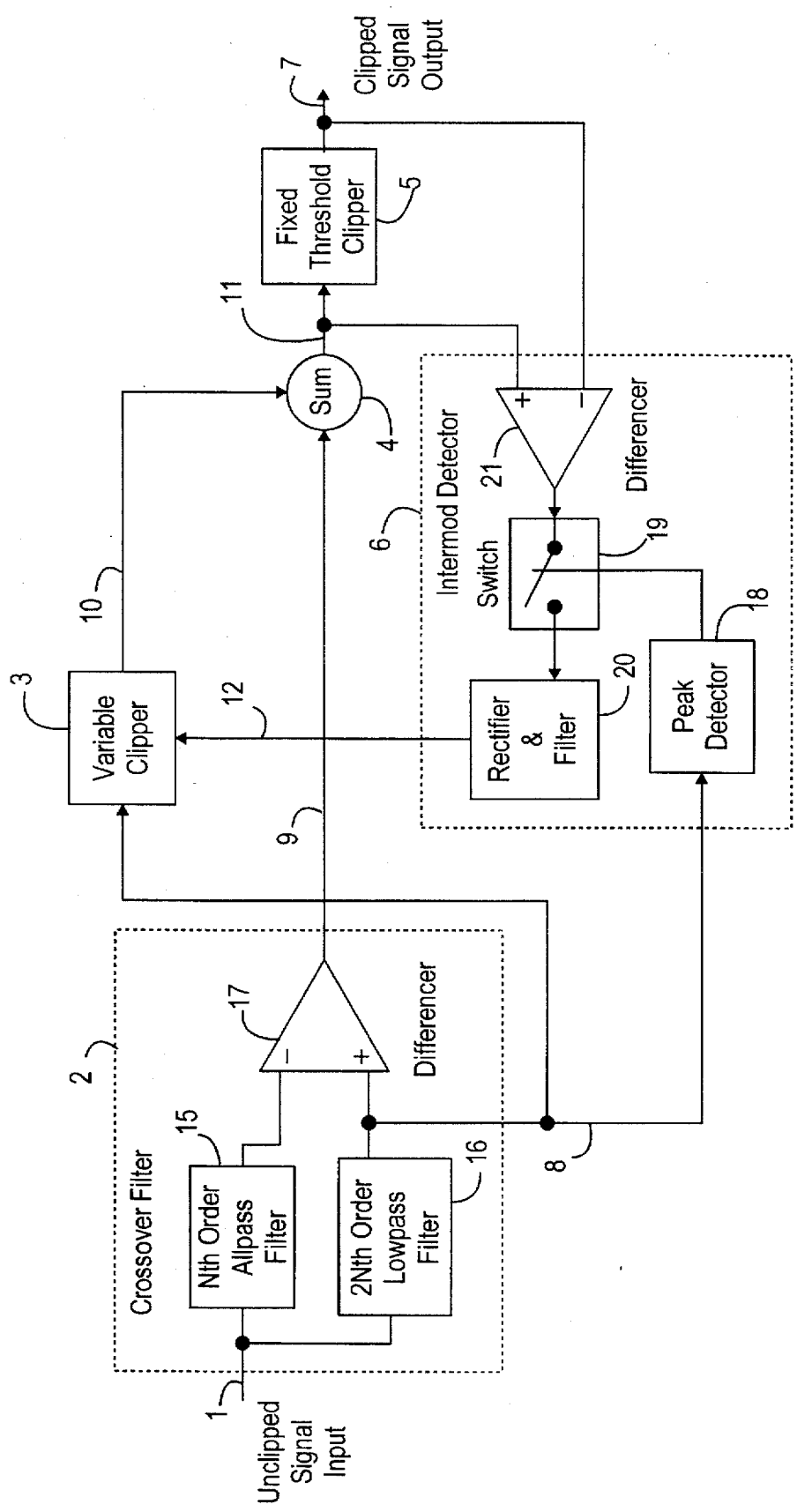
FIG. 3 is a block diagram of the present invention split-band clipper, showing the preferred embodiment of an intermodulation detector.

FIG. 3 illustrates one presently preferred embodiment of the present invention SBC. Referring to FIG. 3, an input signal 1 is applied simultaneously to an Nth order allpass filter 15, and a (2N)th order lowpass filter 16. The allpass filter 15 creates a phase response equal to the phase response of the lowpass filter 16 but gives a flat frequency response. This requirement is met when the order of the allpass filter 15 is half the order of the lowpass filter 16, and the Q value of the allpass and lowpass filters are equal. The relative phase of the outputs of the lowpass filter 16 and allpass filter 15 remain at zero degrees for all frequencies both within the pass and reject bands of both filters. Differencer 17 receives the outputs of both the allpass filter 15 and the lowpass filter 16 and creates, by subtraction, a highpass output signal which is complementary to the output of the lowpass filter 16. The effect of the circuits just described is to create a crossover filter suitable to satisfy the general requirement of the crossover filter 2 described in FIGS. 1 and 2 and having the specific benefit of creating a phase coherent crossover.

For the purposes of the present invention, any crossover slope including first order can work. However, it has been discovered that the performance of the present invention SBC improves if the crossover slopes are higher than first order. However, conventional crossover filters of orders of 2 and greater cause amplitude ripple through the crossover frequency region when the lowpass and highpass outputs are summed. Nonetheless, the phase coherent crossover just described provides a relatively high and desirable crossover slope while still maintaining a perfectly flat summed output response. Therefore, even though the present invention SBC can be constructed with conventional crossover circuits, and no specific crossover response is required to conform to the teachings of the present invention, it is well within the scope and contemplation of the present invention SBC to use a phase coherent crossover.

Referring again to FIG. 3, the lowpass signal 8 is coupled to variable clipper 3 for the purpose of clipping off all peaks exceeding a specific amplitude in the lowpass passband. The clipped lowpass signal 10 and the highpass signal 9 are summed by summing means 4 to produce a full bandwidth output 11 wherein only the frequencies residing within the frequency band of lowpass filter 16 are potentially clipped.

The variable clipper 3 is a variable threshold clipper. Within the present context, this means the clipper provides a clipping amplitude which will be varied according to a control signal 12 applied to the variable clipper. This feature avails the possibility of changing the clip threshold, thus the clipped output amplitude of variable clipper 3.

The output signal of summing means 4 is fed to a fixed threshold clipper 5. This clipper serves to clip all peaks of summed signal 11 at a constant amplitude. If the threshold of variable clipper 3 is set equal to the threshold of fixed clipper 5, then the clipped low frequencies residing in the mix from summing means 4 will just graze the fixed clipper 5. However, if the threshold of variable clipper 3 is set lower than the threshold of fixed clipper 5, then the low frequency clipped peaks within the summed signal 11 will not again be clipped by fixed clipper 5, and will pass through unmodified. The principle of variable low frequency clipping followed by wide band fixed threshold clipping just described is used to realize the intermodulation reduction feature of the present invention.

If the input signal 1 contains both low and high frequencies relative to the crossover frequency, then there can be a potential for severe intermodulation of the two frequencies if they both clip in the fixed clipper 5. Usually, in sound waves, low bass frequencies are higher in amplitude than middle or high audio frequencies. Thus, it is most probable that a large amplitude bass frequency wave will push a smaller coexisting high frequency wave into the fixed clipper during audio signal processing. The present invention alleviates this problem by first clipping the bass frequency wave in the variable clipper 3 at a lower clip threshold than the threshold of fixed clipper 5. The summed signal 11 therefore can contain a clipped low frequency wave and an unclipped high frequency wave. If the clip threshold of the variable clipper 3 is low enough, then there is an improved probability the said high frequency wave will not be pushed into clipping of the fixed clipper 5.

Referring again to FIG. 3, there is shown a method to detect bass-induced high frequency clipping, i.e., low-into-high intermodulation, caused by fixed clipper 5, and a method for automatically reducing the threshold of variable clipper 3. This constitutes a presently preferred embodiment of the intermodulation detector 6 of the present invention SBC. The operation of the intermodulation detector 6 of FIG. 3 is as follows.

Peaks clipped off by fixed clipper 5 are recovered by differencer 21 by subtracting the clipped signal 7 from the uncapped summed signal 11. The clipped peaks so recovered by differencer 21 are fed to switch 19 which opens or closes the path to rectifier 20. If switch 19 is closed so as to allow signal flow to the rectifier and filter 20, then a D.C. voltage will be generated by rectifier and filter 20 in proportion to the amplitude of the said recovered clipped peaks. If the switch 19 is open, then the output of rectifier and filter 20 will settle to zero. The D.C. output signal of rectifier and filter 20 is coupled to the variable clipper 3 by means of the control path 12 in such a manner that an increasing D.C. output from the rectifier and filter 20 causes a decreasing clip threshold of the variable clipper 3. Furthermore, if the rectifier and filter 20 output is zero, then the threshold of variable clipper 3 rests slightly below the threshold of the fixed clipper 5 so as to prevent the additional clipping of low frequencies by the fixed clipper 5. Thus, the differencer 21 will produce an output corresponding only to clipping of frequencies residing above the crossover frequency.

Switch 19 is "opened" and "closed" by a control pulse from peak detector 18 which serves to detect when the bass frequency peaks are of some significant amplitude in the unclipped input signal 1. This is accomplished by coupling the lowpass signal 8 to the input of the peak detector 18. Peak detector 18 is designed in such a way as to close the switch 19 during the time low frequency input peaks exceed a certain amplitude, and to open switch 19 at all other times. The result of this combination of events is to cause the output of rectifier and filter 20 to contain a D.C. voltage proportional to the amount or severity of high frequency clipping occurring simultaneously with significant low frequency signals. The D.C. output of rectifier and filter 20 is thereby a measure or an estimation of the magnitude of low into high intermodulation produced by fixed clipper 5.

It should by now be obvious that there is operating a feedback loop comprising the variable clipper 3, fixed clipper 5, and intermodulation detector 6 causing the clipped amplitude of bass frequencies to be reduced automatically to thus minimize low-into-high clipping intermodulation of the output signal 7.

Figure 4:
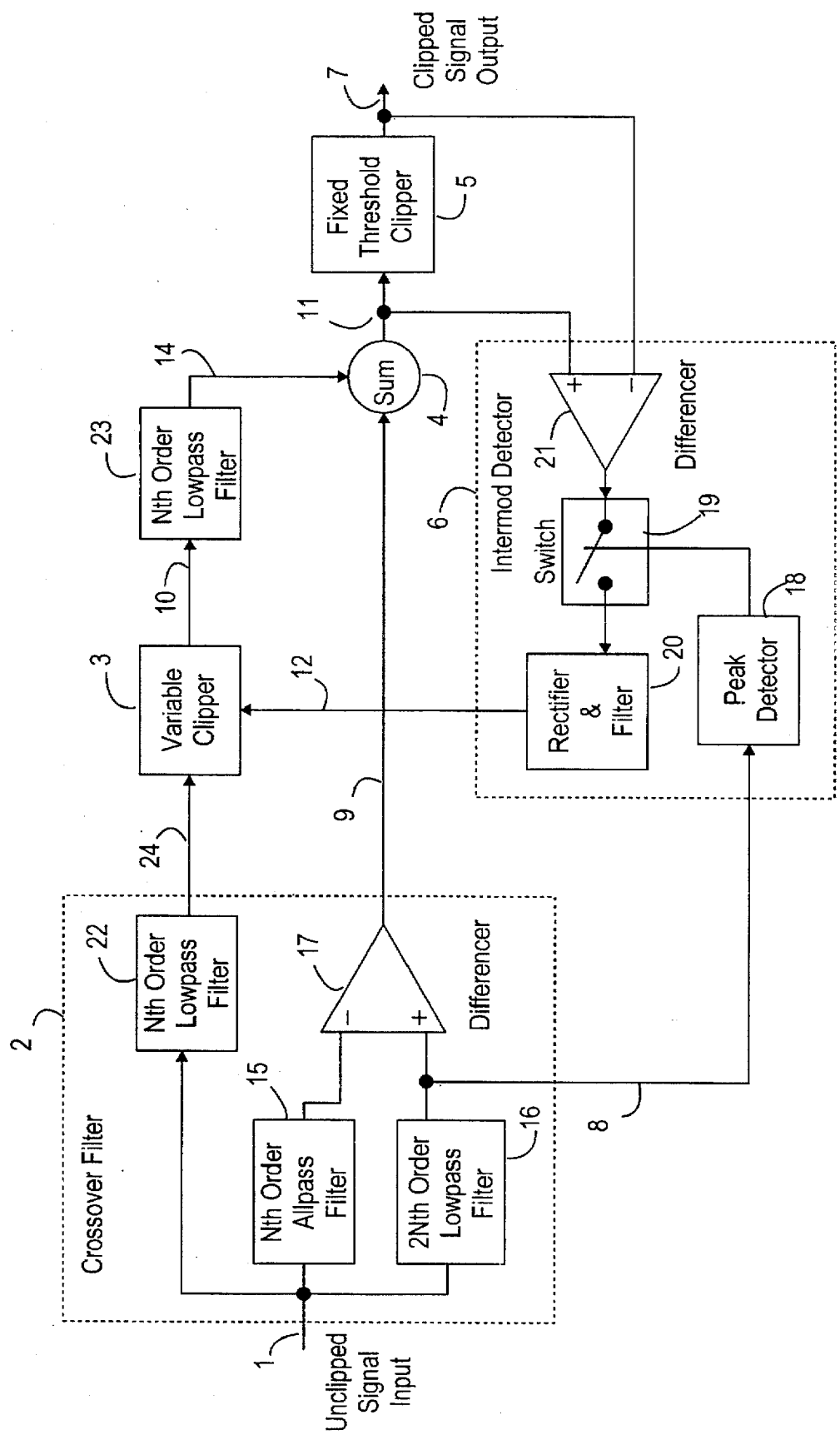
FIG. 4 is a block diagram of the present invention split-band clipper, showing an improved intermodulation detector shown in FIG. 3.

Further improvements in the preferred embodiment of the present invention SBC are detailed in the block diagram of FIG. 4. It can be seen that the diagram of FIG. 4 closely resembles that of the previously described FIG. 3, and in all respects other than the details to be forthwith described, it operates in the same manner as described for FIG. 3. The difference, for the purpose of garnering a reduction of the harmonic distortion of bass clipping, is the addition of one Nth order lowpass filter 23 after the output of variable clipper 3, and another Nth order lowpass filter 22 as an adjunct to the crossover filter 2. Nth order lowpass filter 23 and Nth order lowpass filter 22, when connected in series, comprise a transfer function which equals to the (2N)th order lowpass filter 16. Thus, the net phase response of the output of the Nth order lowpass filter 23 corresponds to the phase response of lowpass signal 8 and therefore, because the crossover herein described is a phase coherent crossover, to the highpass output 9. The lowpass filter 22 is coupled to receive the input signal 1. The output of Nth order lowpass filter 22 is coupled directly to the input of the variable clipper 3 which operates exactly as previously described. The output of variable clipper 3 is coupled directly to the input of Nth order lowpass filter 23. The Nth order lowpass filter 22 serves to act as the low frequency pre-filter to the variable clipper 3 for the purpose of rejecting the high frequencies from the said variable clipper. The Nth order lowpass filter 23, acting as a post-filter for the variable clipper 3, serves to remove many of the clipping generated harmonics which are present at the output of the said variable clipper. The net phase and amplitude response of the chain comprising Nth order lowpass filter 22, variable clipper 3, and Nth order lowpass filter 23 is identical to the chain of FIG. 3 comprising the lowpass signal 8 and the variable clipper 3. Thus, the circuit of FIG. 4 behaves in all ways similar to that of FIG. 3 with the exception of the reduction of low frequency clipping harmonics of the circuit of FIG. 4.

The present invention SBC can be constructed by using many variations of circuitry and still remain within the scope and contemplation of the present invention. For example, there are numerous widely known active and passive lowpass and allpass filter topologies available which can serve the purposes of the teachings of the present invention. For example, any competent practitioner in the field would find that a passive LC filter could be used equally as well as an active filter such as Sallen and Key, State Variable, or other well known types. There are therefore relatively few limits placed upon the ingenuity allowed in the practical design and realization of a useful present invention SBC.

The preferred embodiment of the present invention which will be forthwith described in great detail is just such an ingenious design fully utilizing the teachings of the present invention. The presently preferred embodiment incorporates all the elements described by the teachings of FIG. 4 of the present invention SBC. Since the said preferred embodiment contains details which may not be readily discernible as direct equivalents of the teachings of FIGS. 1 through 4, but which nonetheless are direct equivalents, the equivalency of the circuit structures will first be demonstrated.

Figure 5:
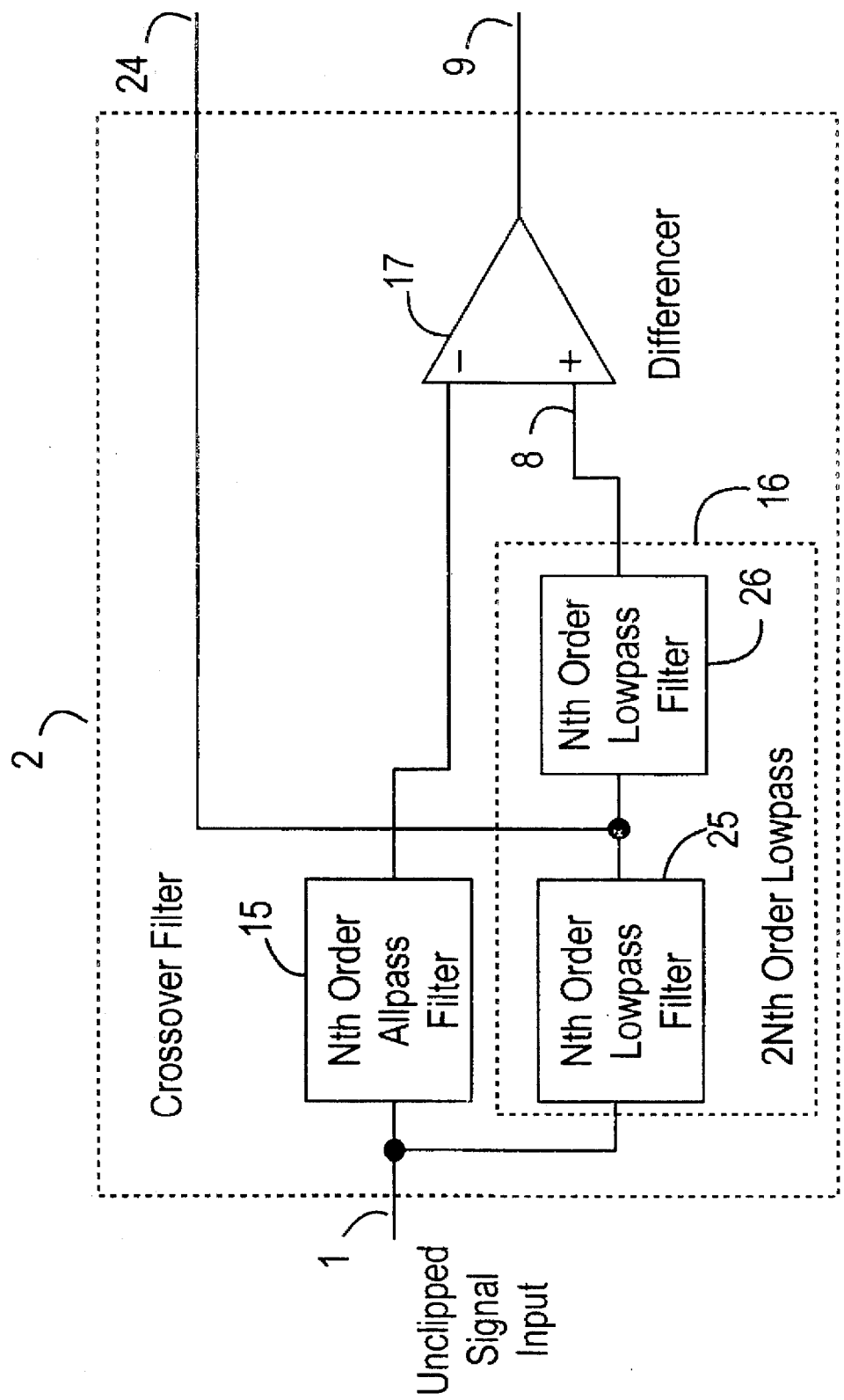
FIG. 5 is a first evolutionary diagram of an equivalent phase matched crossover.

Referring to FIG. 4, there is shown a crossover filter 2 comprising a (2N)th order lowpass filter 16, an Nth order lowpass filter 22, an Nth order allpass filter 15 and a differencer 17. The circuit of FIG. 5 illustrates a functionally equivalent crossover filter 2 fully equal to the crossover filter 2 of FIG. 4 comprising two identical Nth order lowpass filters 25, and 26, an Nth order allpass filter 15 and a differencer 17. The equivalency can be explained as follows. In FIG. 5, a (2N)th order lowpass filter 16 having the same transfer function at the (2N)th order filter 16 of FIG. 4 is constructed of two Nth order filters 25 and 26, connected in series. Since the first Nth order filter 25 is coupled to the input signal 1, the output signal of Nth order lowpass filter 25 is exactly the same as the output signal of Nth order lowpass filter 22 in FIG. 4. Thus it would be redundant to construct a theoretical third Nth order lowpass filter in the circuit of FIG. 5 to provide the function of Nth order lowpass filter 22 of FIG. 4. Lowpass output 24 of FIG. 5 is therefore directly equivalent to the lowpass output 24 of FIG. 4. The highpass outputs 9 of FIGS. 4 and 5 are also directly equivalent because the (2N)th order lowpass function 16 of both figures are equal. By choosing N=2 for the design and choosing to use a state variable filter to construct the lowpass filter 25 in FIG. 5, a convenient and elegant equivalent crossover 2 can be created as illustrated by FIG. 6.

Figure 6:
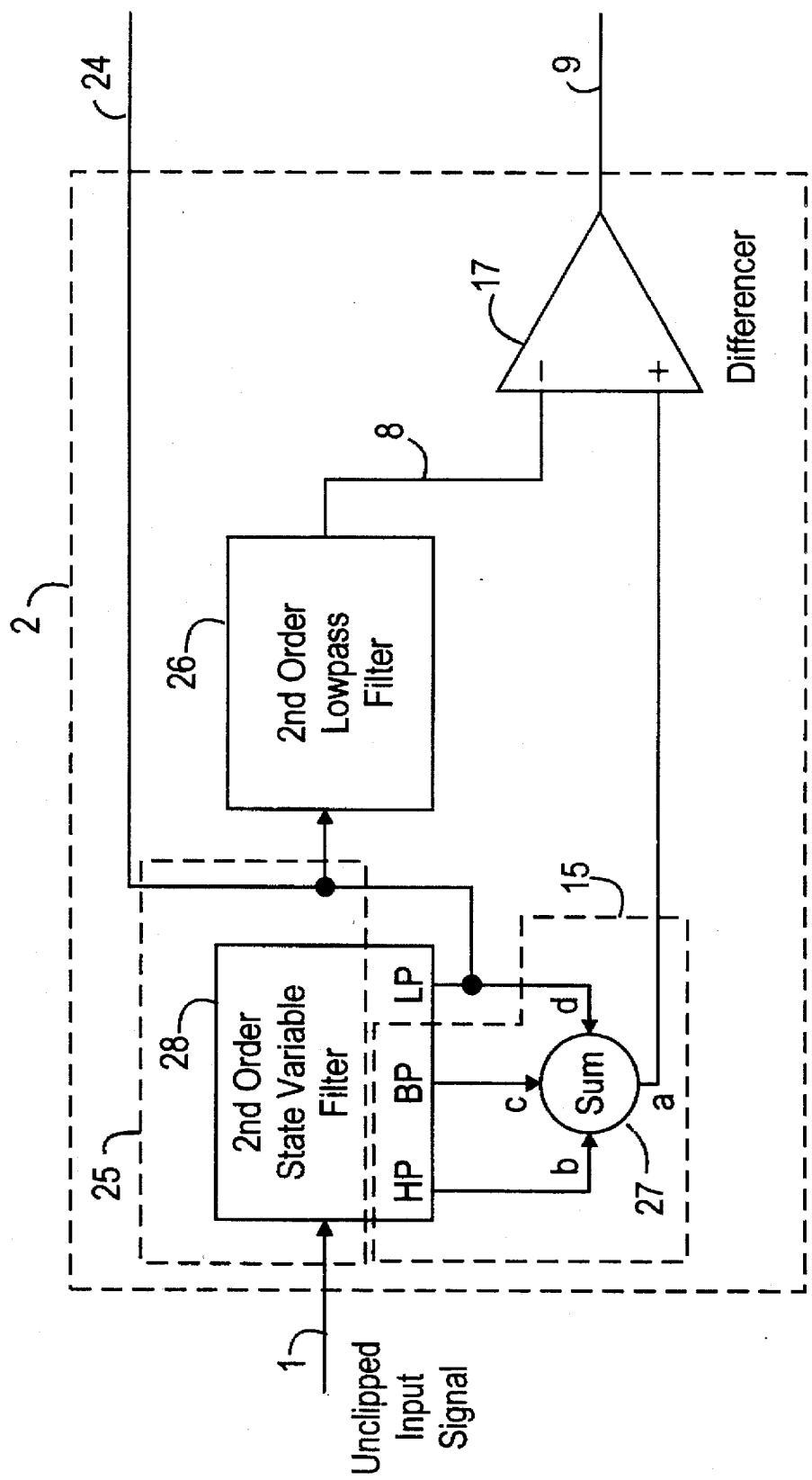
FIG. 6 is a second evolutionary diagram of a phase matched crossover.

Referring to FIG. 6, a crossover filter 2 is shown comprising an Nth order state variable lowpass filter 28, an Nth order lowpass filter 26, a summing means 27, and a differencer 17. An allpass filter 15 of FIG. 6 is equivalent to the allpass filter 15 of FIG. 4 and is constructed by summing the lowpass, bandpass, and highpass outputs of the state variable filter 28 by means of the summing means 27. The summation of the said outputs of filter 28 creates a proper allpass response if the summing means is constructed to follow the equation:

$$a=[b+(D \times c)+d],$$

where D is the damping factor (1/q) of the lowpass response of the state variable filter 28. Therefore, it is readily apparent that the Nth order allpass filter 15 of FIG. 5 and Nth order lowpass filter 25 of FIG. 5 have been equivalently derived from the state variable filter 28 of FIG. 6. It is also readily apparent that the lowpass output signal 24 of FIG. 5 is in every way equal to the lowpass output 24 of FIG. 6. It is also readily apparent that the highpass output 9 of FIG. 5 is in every way equal to the highpass output 9 of FIG. 6. It is therefore readily apparent that the crossover filter 2 of FIG. 5 is in every way the functional equivalent to the crossover filter 2 of FIG. 6.

Now, taking FIG. 4 as a model of the preferred embodiment of the present invention SBC, but not to limit the scope and contemplation of the present invention in any way, specific electronic circuitry will be described in detail to perform each of the referenced functions, allowing a person skilled in the art to construct a viable present invention SBC device and thus demonstrate its novelty, usefulness, and advantages.

Figure 7:
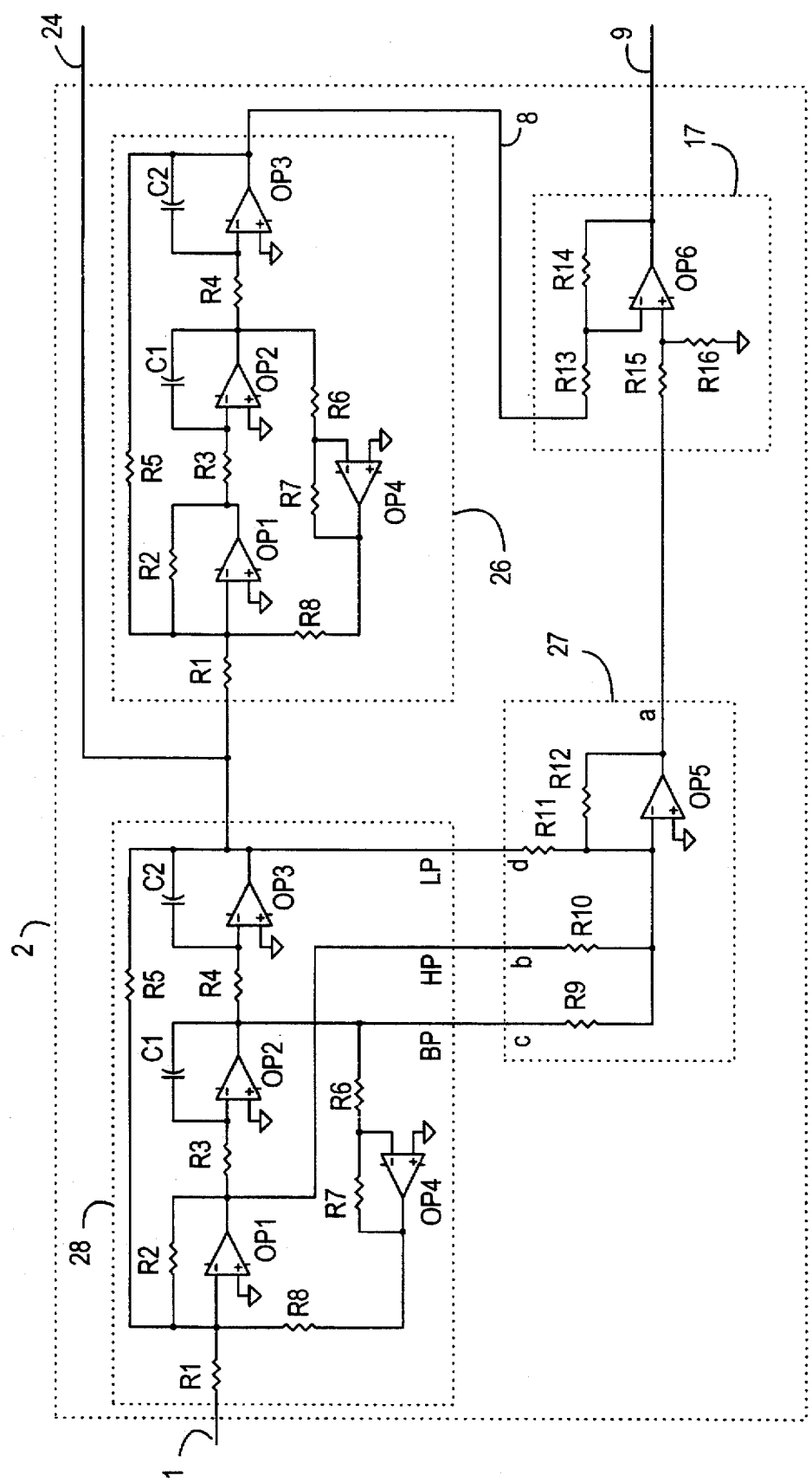
FIG. 7 is a schematic of a preferred embodiment of a crossover filter of the present invention split-band clipper.

Without limiting the present invention in any way, FIG. 7 illustrates the preferred embodiment crossover which is equal to the crossover 2 of FIG. 6. This circuit will now be described in sufficient detail to permit a person skilled in the art to fully understand the operation thereof. Referring to FIG. 7, second order state variable filter 28 is comprised of four opamps OP1 through OP4. The description and analysis of state variable filters is a subject of many text books and technical manuals. Summing amplifier 27 is comprised of OP5 and four resistors R9 through R12. The highpass, bandpass, and lowpass outputs of state variable filter 28 are coupled to the three inputs, "b", "c", and "d", of summing amplifier 27, respectively. The values of resistors R9 through R12 are selected so as to provide a proper allpass response from the output "a" of OP5.

The lowpass filter 26 is comprised of another state variable filter identical to the state variable filter 28. The components of lowpass filter 26 are labeled with the same references as those of state variable filter 28 since their values are identical.

Difference amplifier 17 is comprised of OP6 and resistors R13 through R16. This is an industry standard circuit which should require no further detailed explanation. The lowpass output signal 8 of lowpass filter 26 is coupled to difference amplifier 17 inverting input. The output "a" of summing amplifier 27 is coupled to the difference amplifier 17 non-inverting input. The resulting output of OP6 is thereby through the processes previously described the highpass output signal 9 of the crossover filter 2. The lowpass output of the state variable filter 28, in addition to being coupled to the input of lowpass filter 26, is also the lowpass output signal 24 of the crossover filter 2.

Without limiting the present invention in any way, but to help create a practical demonstration of the present invention, by way of example only, the values of the electronic components of FIG. 7 may be as follows: R1, R2, R5, R6, R7, R10, R11, R12, R13, R14, R15 and R16 equal to 10KΩ; R8 and R9 equal to 7.07KΩ; and R3 and R4 equal to 100KΩ. By way of example only, C1 and C2 equal to 0.01 μF. By way of example only, OP1 through OP6 equal to the industry standard LF353. Thus, the crossover filter 2 of the preferred embodiment of the present invention SBC is fully described.

Figure 8:
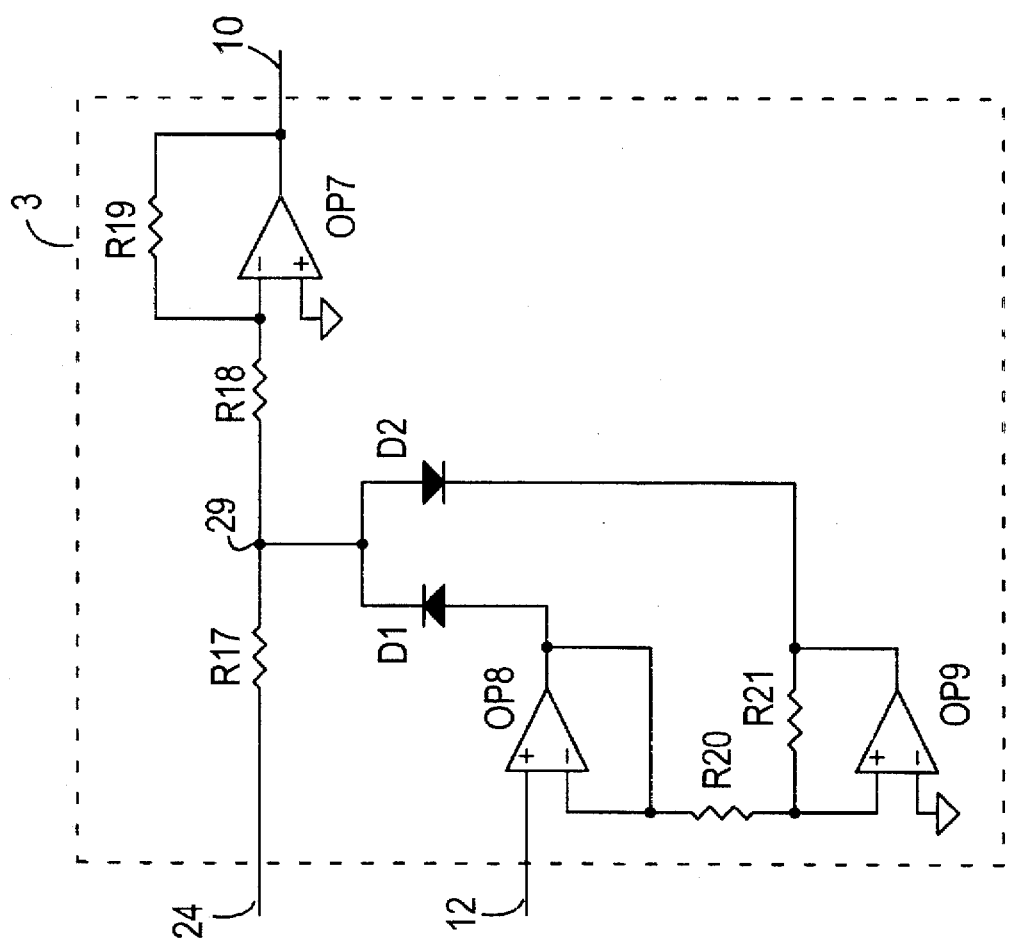
FIG. 8 is a schematic of a preferred embodiment of a variable clipper of the present invention split-band clipper.

The preferred embodiment of the variable clipper 3 of FIG. 4 is illustrated in FIG. 8. This circuit comprises three opamps OP7 through OP9, five resistors R17 through R21, and two diodes D1 and D2.

Without limiting the present invention in any way, by way example only, the referenced parts of FIG. 8 may be as follows: R17 equals 1KΩ; R18 equals 9KΩ; and R19, R20 and R21 equal 10KΩ. By way of example only, D1 and D2 equal to 1N914B silicon diode. By way of example only, OP7, OP8, and OP9 equal to the industry standard LF353 opamp.

The circuit operation of FIG. 8 will next be described taking FIG. 8 and FIG. 4 together as appropriate. The variable clipper 3 comprises a resistive branch of R17 and R18 which create the input resistance of an inverting amplifier stage comprising OP7 with the feedback resistance of R19. The value of R17 is much smaller than that of R18 and the sum of R17 and R18 equals the value of R19. Thus, the net gain of the said inverting amplifier stage, irrespective of polarity, is unity. It should be apparent that since the stated value of R17 is one ninth the value of R18, a signal amplitude of nine tenths the input signal 24 is present at the node 29. This ratio is not of particular significance, but is merely a convenient value for practical usage.

Diodes D1 and D2, respective to node 29, are biased in the reverse direction by d.c. amplifiers OP8 and OP9. It should be apparent that OP8 is connected as a standard voltage follower while OP9 is connected as a unity gain inverter to supply an output voltage of equal magnitude but opposite polarity to the output of OP8. The input 12 to OP8 is equivalent to the control input 12 of the variable clipper of FIG. 4. Without limiting the present invention in any way, it will be expected for the present purposes that the control signal 12 supplied to OP8 will reside in the range of zero to several negative volts. Thus, diodes D1 and D2 will remain reverse biased and out of significant current conduction until the input signal 24 is of sufficient magnitude to cause forward bias of one or both of the said diodes during said signal peaks of either polarity. When such forward diode conduction takes place, the low output impedances of the opamps OP8 and OP9 will supply enough current to hold the peak amplitude of the signal at node 29 to a constant "clipped" amplitude equal to the input control voltage 12 plus the forward diode drop of approximately 0.55 volts. OP7 with feedback resistor R19 produce an output signal 10 equal to the inverse of input signal 24 but also with variable clipping applied in accordance with the clipper control signal 12. Thus, the preferred embodiment of the variable clipper of the present invention is fully described.

Figure 9:
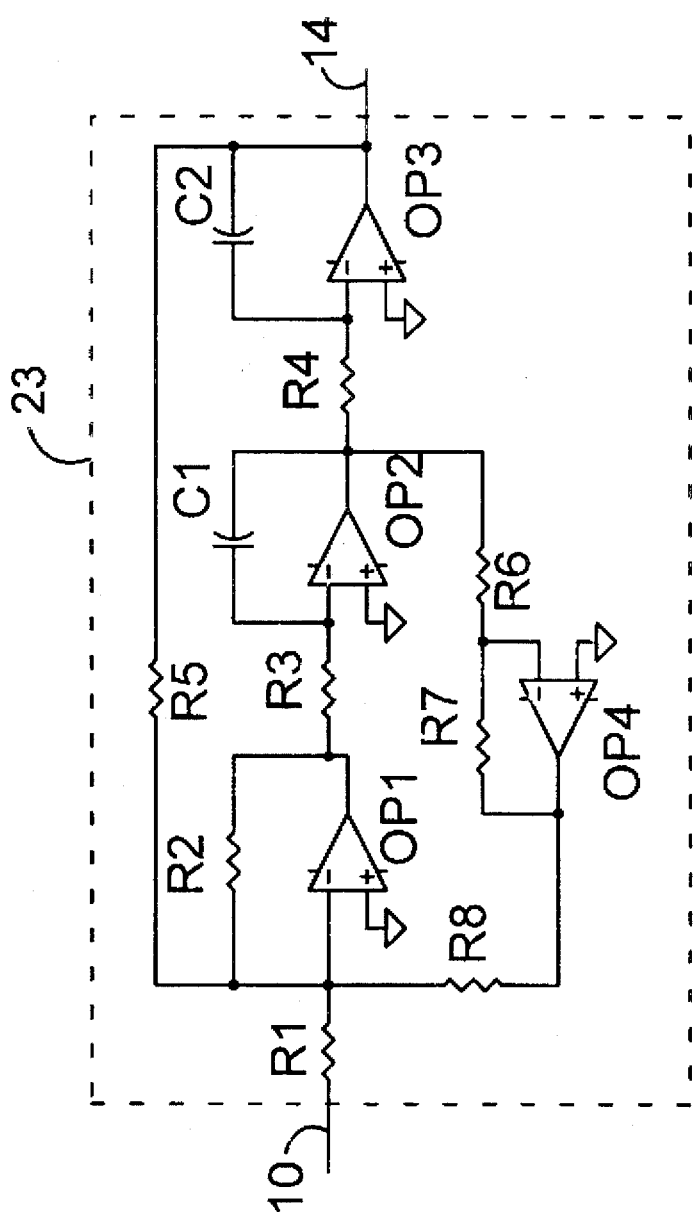
FIG. 9 is a schematic of a preferred embodiment of a lowpass filter of the present invention split-band clipper.

Next, without limiting the present invention in any way, the preferred embodiment of the Nth order lowpass filter 23 of FIG. 4 will be described as shown in FIG. 9. Referring to FIG. 9, it should be readily apparent that this filter is identical to the state variable lowpass filters used in the crossover circuit of FIG. 7. This being the case, all circuit values referenced in FIG. 8 are given to be equal to the corresponding referenced components previously listed for FIG. 7.

Figure 10:
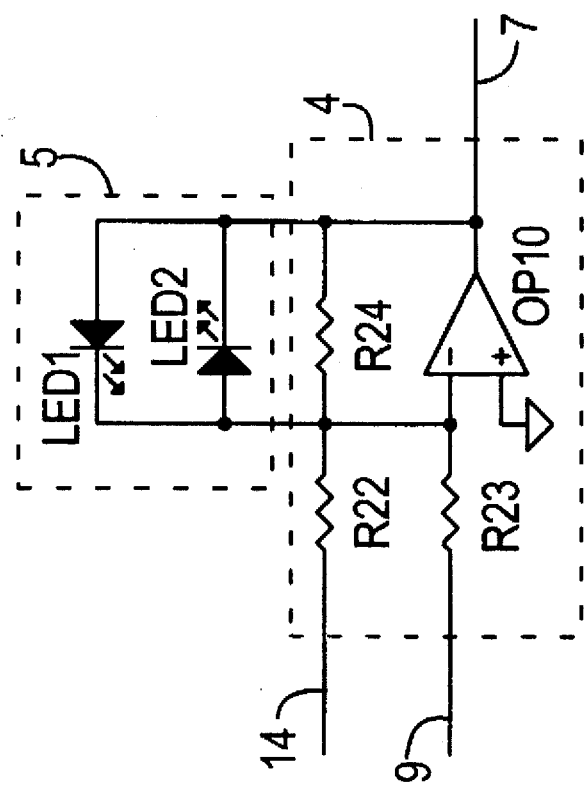
FIG. 10 is a schematic of a preferred embodiment of a summer and a fixed clipper of the present invention split-band clipper.

The preferred embodiment of the summing amplifier 4 and fixed threshold clipper 5 of FIG. 4 will next be described in detail as illustrated in FIG. 10. Referring to FIG. 10, it should be readily apparent that the functions of summing and clipping are combined into a single conventional opamp circuit. The output signal 14 of the previously described lowpass filter 23 shown in FIG. 4 is coupled to resistor R22 thus comprising one of two summing inputs to opamp OP10. The highpass signal 9 of crossover 2 shown in FIG. 4 is coupled to R23 comprising the second summing input to opamp OP10. Feedback resistor R24 completes a two input inverting summing amplifier of conventional design. The fixed clipper comprises two light emitting diodes LED1 and LED2 coupled as feedback elements in parallel with feedback resistor R24. The forward voltage drop of typical light emitting diodes is approximately 1.9 volts. Therefore, the two light emitting diodes connected as feedback elements to OP10 will cause a fixed threshold of clipping to occur at approximately 1.9 peak volts for all output signals of OP10. It should be obvious that combining the functions of a summing means 4 and a fixed threshold clipping means 5 into a single circuit in no way violates the teachings of the present invention because the said teachings specify only the functions to be provided, but not specifically in any particular manner.

Figure 11:
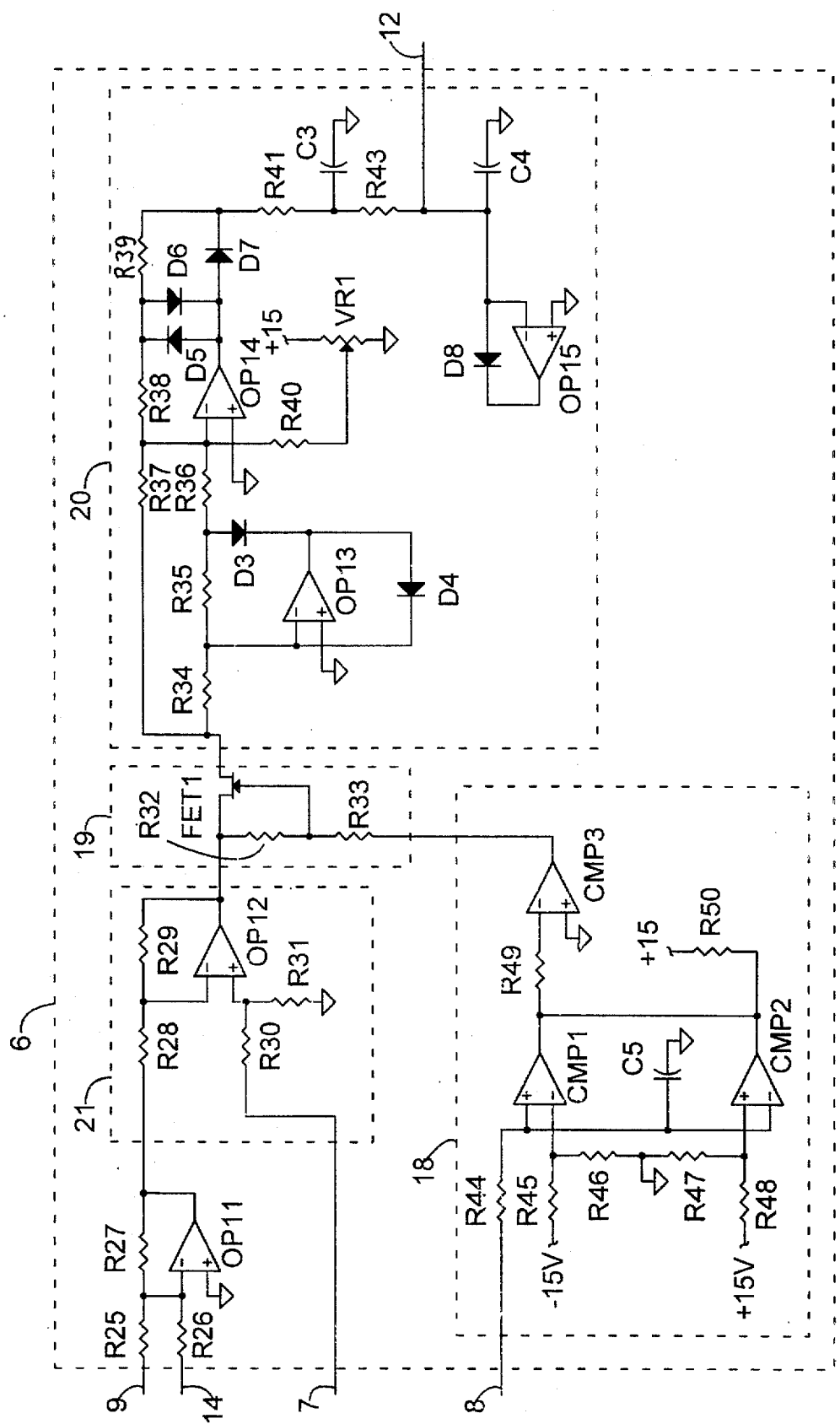
FIG. 11 is a schematic of a preferred embodiment of an intermodulation detector of the present invention split-band clipper.

Finally, the preferred embodiment of the intermodulation detector 6 of FIG. 4 will be described to complete the description of the preferred embodiment of the present invention SBC. FIG. 11 illustrates the said preferred embodiment intermodulation detector. By way of example only, R25, R26, R27, R28, R29, R30, R31, R33, R34, R35, R36, R43, R44, R49, and R50 equal to 10KΩ; R32 equals to 100KΩ; R45 and R48 equal to 15KΩ; R46 and R47 equal to 499 Ω; R52 equals to 20KΩ; R55 equals to 150KΩ; R56 equals to 47.5KΩ; R40 and R55 equal to 1MΩ; and VR1 equals to 20KΩ. By way of example only, D1 through D8 equal to 1N914B silicon diode. By way of example only, OP11 through OP15 equal to LF353. By way of example only, CMP1 through CMP3 equal to LM339. By way of example only, C3 equals to 0.1 µF; C4 equals to 0.47 µF; and C5 equals to 0.0022 µF.

Referring to FIG. 11, there is shown a peak detector 18, a switch 19, a rectifier and filter 20, and a differencer 21. The peak detector 18 will first be described. It should be readily apparent that peak detector 18 is a conventional window comparator. CMP1 and CMP2 are open collector output comparators with their outputs connected together in a "wired or" configuration. Resistor R50 serves to pull up the comparator outputs to +15V when no signal is detected. If low the peak level of low frequency signal 8 is greater than the detector's positive or negative threshold, then the said "wired or" output goes to −15V. CMP3 is also an open collector output comparator which serves as a logic inverter to reverse the polarity of the "wired or" output. The output of CMP3 therefore rests at −15V until a peak is detected when it switches to a high impedance state, thus outputting zero volts. The peak detector's output from CMP3 is coupled to switch 19.

Switch 19 comprises an n-channel j-let device FET1 and resistors R32 and R33. R33 serves as the switch control input and is coupled directly to the peak detector output of CMP3. When the output from CMP3 is at negative 15V, FET1 is pinched off, i.e., acting as an open switch. When the output of CMP3 goes to a high impedance state, i.e., a peak is detected, then FET1 is not pinched off and acts as a closed switch.

The difference amplifier 21 comprises a common differential amplifier receiving the clipped output 7 of the fixed clipper 5 and an unclipped copy of that same signal generated by OP11. This differs slightly from FIG. 4 which illustrates the differencer 21 receiving two signals, clipped signal 7 and the pre-clipped sum signal which is the output of the summer stage 4. Since the preferred embodiment combined the functions of summer 4 and clipper 5 into one opamp circuit, an unclipped sum signal must be created by a separate amplifier. This is accomplished by the circuit of OP11, R25, R26, and R27. It should be readily apparent that this circuit is an exact replica of the circuit of FIG. 10 with the exception of the LED clipper diodes. Thus, the output of OP11 provides a functional equivalent of the output of the summer 4 of FIG. 4. The difference amplifier 21 produces no output until the fixed clipper 5 actually clips peaks. At that instant an output is generated from the differencer resembling the portion of the waveform which has been clipped off. The output of differencer 21 which is OP12 is coupled to the input of switch 19 comprising the source terminal of the j-fet FET1.

Referring still to FIG. 11, the output of switch 19 comprising the drain terminal of j-fet FET1 is coupled to the input of the rectifier and filter 20. It should be readily apparent that the circuit including OP13 and OP14 is a conventional "absolute value" full wave rectifier circuit with a slight modification. R40 along with trimmer VR1 serve to allow a d.c. offset to be asserted in the output of OP14. Diodes D5 through D7 along with R41, C3, R43, and C4 create a certain desired attack and release peak filter. The output of the said peak filter is the variable clipper control signal 12 which rests at a negative d.c. level set by the adjustment of VR1 when no peaks are supplied to the rectifier. Without limiting the present invention in any way, the said d.c. resting level may be approximately 2 volts. When peaks are supplied to the rectifier by switch 19, then the output 12 will tend to move toward zero volts, or in the case of a great amount of clipping in the fixed clipper 5, even to a positive potential. Such a positive potential is undesirable, and it is therefore clamped to zero volts by active diode clamper OP15.

It should by now be obvious that the circuits of the preferred embodiment so far described in detail comprise, without limiting the scope and contemplation, a split band clipper with intermodulation reduction complying with the teachings of the present invention.

Defined in detail, the present invention is a split band clipper, comprising: (a) crossover filter including a first Nth order lowpass filter, an Nth order allpass filter, a (2N)th order lowpass filter and a first differencer, the first Nth order lowpass and the Nth order allpass filters each having means for receiving an unclipped input signal and producing an output signal, the (2N)th order lowpass filter having means for receiving the unclipped input signal and producing a lowpass output signal, and the first differencer having means for receiving the output signals of the allpass filter and the (2N)th order lowpass filter and producing a highpass output signal; (b) a variable clipper having means for receiving the output signal of the first Nth order lowpass filter which serves to act as the low frequency pre-filter for rejecting the high frequencies from the variable clipper and producing a variably clipped lowpass output signal; (c) a second Nth order lowpass filter having means for receiving the variably clipped lowpass output signal from the variable clipping means and removing the clipping generated harmonics in the variably clipped lowpass output signal of the variable clipping means and producing a filtered variably clipped lowpass output signal; (d) a summing member having means for receiving and adding together the highpass output signal from the first differencer and the filtered variably clipped lowpass output signal from the second Nth order lowpass filter and producing a summed output signal; (e) a fixed clipper having means for clipping the summed output signal from the summing means at a fixed threshold level and producing a clipped output signal; (f) an intermodulation detector including a second differencer, a switch, a rectifier and filter and a peak detector; (g) the second differencer having means for receiving the summed output signal from the summing member and the clipped output signal of the fixed clipper and producing a recovered peak clipped output signal corresponding to clipping of frequencies residing above a crossover frequency; (h) the peak detector coupled between the (2N)th order lowpass filter and the switch for detecting the amplitude of the bass frequency peaks in said unclipped input signal and producing a control pulse output signal for controlling the switch; (i) the switch connected between the second differencer and the rectifier and filter and controlled by the control pulse of the peak detector, such that when the switch is in a closed condition, it allows the peak clipped output signal to flow through to the rectifier and filter to produce a D.C. voltage proportion to the amplitude of the recovered peak clipped output signal, and when the switch is in an opened condition, the rectifier and filter settles to zero; and (j) the rectifier and filter coupled to the variable clipper such that an increasing D.C. output from the rectifier and filter causes a decreasing clip threshold of the variable clipper, but when the rectifier and filter is zero, the threshold of the variable clipper rests slightly below the threshold of the fixed clipper so as to prevent the additional clipping of low frequencies by the fixed clipper.

Defined broadly, the present invention is a split band clipper, comprising: (a) a crossover means for receiving an unclipped input signal and splitting the unclipped input signal into a lowpass output signal and a highpass output signal; (b) a variable clipping means for receiving the lowpass output signal from the crossover means and producing a variably clipped lowpass output signal; (c) an Nth order lowpass filter for receiving the variably clipped lowpass output signal from the variable clipping means and removing the clipping generated harmonics in the variably clipped lowpass output signal of the variable clipping means and producing a filtered variably clipped lowpass output signal; (d) a summing means for receiving and adding together the highpass output signal from the crossover means and the filtered variably clipped lowpass output signal from the Nth order lowpass filter and producing a summed output signal; (e) a fixed clipper means for clipping the summed output signal from the summing means at a fixed threshold level and producing a clipped output signal; (f) an intermodulation detector including a differencer, a switch, a rectifier and filter and a peak detector; (g) the differencer for receiving the summed output signal from the summing means and the clipped output signal from the fixed clipper means and producing a recovered peak clipped output signal corresponding to clipping of frequencies residing above a crossover frequency; (h) the peak detector coupled between the crossover means and the switch for detecting the amplitude of the bass frequency peaks in the unclipped input signal and producing a control pulse output signal for controlling the switch; (i) the switch connected between the differencer and the rectifier and filter and controlled by the control pulse output signal of the peak detector, such that when the switch is in a closed condition, it allows the peak clipped output signal to flow through to the rectifier and filter to produce a D.C. voltage proportion to the amplitude of the recovered peak clipped output signal, and when the switch is in an opened condition, the rectifier and filter settles to zero; and (j) the rectifier and filter coupled to the variable clipping means such that an increasing D.C. output from the rectifier and filter causes a decreasing clip threshold of the variable clipping means, but when the rectifier and filter is zero, the threshold of the variable clipping means rests slightly below the threshold of the fixed clipper means so as to prevent the additional clipping of low frequencies by the fixed clipper means.

Defined more broadly, the present invention is a split-band clipper, comprising: (a) a crossover means for splitting an input signal into a lowpass output signal and a highpass output signal; (b) a variable clipping means for receiving the lowpass output signal from the crossover means and producing availably clipped lowpass output signal; (c) a lowpass filter for receiving the variably clipped lowpass output signal from the variable clipping means and producing a filtered variably clipped lowpass output signal; (d) a summing means for adding together the highpass output signal from the crossover means and the filtered variably clipped lowpass output signal from the lowpass filter and producing a summed output signal; (e) a fixed clipper means for receiving the summed output signal of the summing means and producing a clipped output signal at a fixed threshold level; (f) an intermodulation detector to measure the amount of high frequency clipping in the fixed clipper means caused by presence of low frequencies; and (g) the intermodulation detector coupled to the variable clipping means to reduce the threshold of clipping of low frequencies by the variable clipping means whenever high frequency clipping is detected in the fixed clipper means as a result of the presence of low frequencies.

Defined alternatively in detail, the present invention is a split band clipper, comprising: (a) a crossover filter including an Nth order allpass filter, a (2N)th order lowpass filter and a first differencer, the Nth order allpass filter having means for receiving an unclipped input signal and producing an output signal, the (2N)th order lowpass filter having means for receiving the unclipped input signal and producing a lowpass output signal, and the first differencer having means for receiving the output signals of the allpass filter and the lowpass filter and producing a highpass output signal; (b) a variable clipper having means for receiving the lowpass output signal from the lowpass filter and producing a variably clipped lowpass output signal; (c) a summing member having means for receiving and adding together the highpass output signal from the first differencer and the variably clipped lowpass output signal from the variable clipper and producing a summed output signal; (d) a fixed clipper having means for clipping the summed output signal from the summing member at a fixed threshold level and producing a clipped output signal; (e) an intermodulation detector including a second differencer, a switch, a rectifier and filter and a peak detector; (f) the peak detector coupled between the lowpass filter and the switch for detecting the amplitude of the bass frequency peaks in the unclipped input signal and producing a control pulse output signal for controlling the switch; (g) the second differencer having means for receiving the summed output signal from the summing member and the clipped output signal from the fixed clipper and producing a recovered peak clipped output signal corresponding to clipping of frequencies residing above a crossover frequency; (h) the switch connected between the second differencer and the rectifier and filter and controlled by the control pulse output signal of the peak detector, such that when the switch is in a closed condition, it allows the peak clipped output signal to flow through to the rectifier and filter to produce a D.C. voltage proportion to the amplitude of the recovered peak clipped output signal, and when the switch is in an opened condition, the rectifier and filter settles to zero; and (i) the rectifier and filter coupled to the variable clipper such that an increasing D.C. output from the rectifier and filter causes a decreasing clip threshold of the variable clipper, but when the rectifier and filter is zero, the threshold of the variable clipper rests slightly below the threshold of the fixed clipper so as to prevent the additional clipping of low frequencies by the fixed clipper.

Defined alternatively broadly, the present invention is a split band clipper, comprising: (a) a crossover means for receiving an unclipped input signal and splitting the unclipped input signal into a lowpass output signal and a highpass output signal; (b) a variable clipping means for receiving the lowpass output signal from the crossover means and producing a variably clipped lowpass output signal; (c) a summing means for receiving and adding together the highpass output signal from the crossover means and the variably clipped lowpass output signal of the variable clipping means and producing a summed output signal; (d) a fixed clipper means for clipping the summed output signal from the summing means at a fixed threshold level and producing a clipped output signal; (e) an intermodulation detector including a differencer, a switch, a rectifier and filter and a peak detector; (f) the peak detector coupled between the crossover means and the switch for detecting the amplitude of the bass frequency peaks and producing a control pulse output signal for controlling the switch; (g) the differencer for receiving the output signal from the summing means and the clipped output signal from the fixed clipper means and producing a recovered peak clipped output signal corresponding to clipping of frequencies residing above a crossover frequency; (h) the switch connected between the differencer and the rectifier and filter and controlled by the control pulse of the peak detector, such that when the switch is in a closed condition, it allows the peak clipped output signal to flow through to the rectifier and filter to produce a D.C. voltage proportion to the amplitude of the recovered peak clipped output signal, and when the switch is in an opened condition, the rectifier and filter settles to zero; and (i) the rectifier and filter coupled to the variable clipping means such that an increasing D.C. output from the rectifier and filter causes a decreasing clip threshold of the variable clipping means, but when the rectifier and filter is zero, the threshold of the variable clipping means rests slightly below the threshold of the fixed clipper means so as to prevent the additional clipping of low frequencies by the fixed clipper means.

Defined alternatively more broadly, the present invention is a split band clipper, comprising: (a) a crossover means for splitting an input signal into a lowpass output signal and a highpass output signal; (b) a variable clipping means for receiving the lowpass output signal from the crossover means and producing a variably clipped lowpass output signal; (c) a summing means for receiving and adding together the highpass output signal from the crossover means and the variably clipped output signal from the variable clipping means and producing a summed output signal; (d) a fixed clipper means for clipping the summed output signal from the summing means at a fixed threshold level; (e) an intermodulation detector to measure the amount of high frequency clipping in the fixed clipper means caused by presence of low frequencies; and (f) the intermodulation detector coupled to the variable clipping means to reduce the threshold of clipping of low frequencies by the variable clipping means whenever high frequency clipping is detected in the fixed clipper means as a result of the presence of low frequencies.

Of course the present invention is not intended to be restricted to any particular form or arrangement, or any specific embodiment disclosed herein, or any specific use since the same may be modified in various particulars or relations without departing from the spirit or scope of the claimed invention hereinabove shown and described of which the apparatus shown is intended only for illustration and for disclosure of an operative embodiment and not to show all of the various forms or modifications in which the present invention might be embodied or operated.

The present invention has been described in considerable detail in order to comply with the patent laws by providing full public disclosure of at least one of its forms. However, such detailed description is not intended in any way to limit the broad features or principles of the present invention, or the scope of patent monopoly to be granted.

What is claimed is:

1. A split band clipper, comprising:
   a. a crossover filter including a first Nth order lowpass filter, an Nth order allpass filter, a (2N)th order lowpass filter and a first differencer, the first Nth order lowpass and the Nth order allpass filters each having means for receiving an unclipped input signal and producing an output signal, the (2N)th order lowpass filter having means for receiving the unclipped input signal and producing a lowpass output signal, and the first differencer having means for receiving the output signals of the allpass filter and the (2N)th order lowpass filter and producing a highpass output signal;
   b. a variable clipper having means for receiving said output signal of said first Nth order lowpass filter which serves to act as the low frequency pre-filter for rejecting the high frequencies from the variable clipper and producing a variably clipped lowpass output signal;
   c. a second Nth order lowpass filter having means for receiving said variably clipped lowpass output signal from said variable clipping means and removing the clipping generated harmonics in said variably clipped lowpass output signal of said variable clipping means and producing a filtered variably clipped lowpass output signal;
   d. a summing member having means for receiving and adding together said highpass output signal from said first differencer and said filtered variably clipped lowpass output signal from said second Nth order lowpass filter and producing a summed output signal;
   e. a fixed clipper having means for clipping said summed output signal from said summing means at a fixed threshold level and producing a clipped output signal;
   f. an intermodulation detector including a second differencer, a switch, a rectifier and filter and a peak detector;
   g. said second differencer having means for receiving said summed output signal from said summing member and said clipped output signal of said fixed clipper and producing a recovered peak clipped output signal corresponding to clipping of frequencies residing above a crossover frequency;
   h. said peak detector coupled between said (2N)th order lowpass filter and said switch for detecting the amplitude of the bass frequency peaks in said unclipped input signal and producing a control pulse output signal for controlling said switch;
   i. said switch connected between said second differencer and said rectifier and filter and controlled by said control pulse of said peak detector, such that when said switch is in a closed condition, it allows said peak clipped output signal to flow through to said rectifier and filter to produce a D.C. voltage proportion to the amplitude of said recovered peak clipped output signal, and when said switch is in an opened condition, said rectifier and filter settles to zero; and
   j. said rectifier and filter coupled to said variable clipper such that an increasing D.C. output from said rectifier and filter causes a decreasing clip threshold of said variable clipper, but when said rectifier and filter is zero, the threshold of said variable clipper rests slightly below the threshold of said fixed clipper so as to prevent the additional clipping of low frequencies by said fixed clipper.

2. The split-band clipper in accordance with claim 1 wherein said (2N)th order lowpass filter includes two Nth order lowpass filters connected in series.

3. A split band clipper, comprising:
   a. a crossover means for receiving an unclipped input signal and splitting the unclipped input signal into a lowpass output signal and a highpass output signal;
   b. a variable clipping means for receiving said lowpass output signal from said crossover means and producing a variably clipped lowpass output signal;
   c. an Nth order lowpass filter for receiving said variably clipped lowpass output signal from said variable clipping means and removing the clipping generated harmonics in said variably clipped lowpass output signal of said variable clipping means and producing a filtered variably clipped lowpass output signal;

d. a summing means for receiving and adding together said highpass output signal from said crossover means and said filtered variably clipped lowpass output signal from said Nth order lowpass filter and producing a summed output signal;

e. a fixed clipper means for clipping said summed output signal from said summing means at a fixed threshold level and producing a clipped output signal;

f. an intermodulation detector including a differencer, a switch, a rectifier and filter and a peak detector;

g. said differencer for receiving said summed output signal from said summing means and said clipped output signal from said fixed clipper means and producing a recovered peak clipped output signal corresponding to clipping of frequencies residing above a crossover frequency;

h. said peak detector coupled between said crossover means and said switch for detecting the amplitude of the bass frequency peaks in said unclipped input signal and producing a control pulse output signal for controlling said switch;

i. said switch connected between said differencer and said rectifier and filter and controlled by said control pulse output signal of said peak detector, such that when said switch is in a closed condition, it allows said peak clipped output signal to flow through to said rectifier and filter to produce a D.C. voltage proportion to the amplitude of said recovered peak clipped output signal, and when said switch is in an opened condition, said rectifier and filter settles to zero; and j. said rectifier and filter coupled to said variable clipping means such that an increasing D.C. output from said rectifier and filter causes a decreasing clip threshold of said variable clipping means, but when said rectifier and filter is zero, the threshold of said variable clipping means rests slightly below the threshold of said fixed clipper means so as to prevent the additional clipping of low frequencies by said fixed clipper means.

4. The split-band clipper in accordance with claim 3 wherein said crossover means further includes an Nth order lowpass filter for receiving said unclipped input, an Nth order allpass filter for receiving said unclipped input signal, a (2N)th order lowpass filter for receiving said unclipped input signal and a differencer.

5. The split-band clipper in accordance with claim 4 wherein said (2N)th order lowpass filter includes two Nth order lowpass filters connected in series.

6. A split-band clipper, comprising:

a. a crossover means for splitting an input signal into a lowpass output signal and a highpass output signal;

b. a variable clipping means for receiving said lowpass output signal from said crossover means and producing a variably clipped lowpass output signal;

c. a lowpass filter for receiving said variably clipped lowpass output signal from said variable clipping means and producing a filtered variably clipped lowpass output signal;

d. a summing means for adding together said highpass output signal from said crossover means and said filtered variably clipped lowpass output signal from said lowpass filter and producing a summed output signal;

e. a fixed clipper means for receiving said summed output signal of said summing means and producing a clipped output signal at a fixed threshold level;

f. an intermodulation detector to measure the amount of high frequency clipping in said fixed clipper means caused by presence of low frequencies; and g. said intermodulation detector coupled to said variable clipping means to reduce the threshold of clipping of low frequencies by said variable clipping means whenever high frequency clipping is detected in said fixed clipper means as a result of the presence of low frequencies.

7. The split-band clipper in accordance with claim 6 wherein said crossover means further includes an Nth order lowpass filter for receiving said unclipped input, an Nth order allpass filter for receiving said unclipped input signal, a (2N)th order lowpass filter for receiving said unclipped input signal and a differencer.

8. The split-band clipper in accordance with claim 7 wherein said (2N)th order lowpass filter includes two Nth order lowpass filters connected in series.

9. The split-band clipper in accordance with claim 7 wherein said intermodulation detector further includes a differencer, a switch, a rectifier and filter and a peak detector.

10. A split band clipper, comprising:

a. a crossover filter including an Nth order allpass filter, a (2N)th order lowpass filter and a first differencer, the Nth order allpass filter having means for receiving an unclipped input signal and producing an output signal, the (2N)th order lowpass filter having means for receiving the unclipped input signal and producing a lowpass output signal, and the first differencer having means for receiving the output signals of the allpass filter and the lowpass filter and producing a highpass output signal;

b. a variable clipper having means for receiving said lowpass output signal from said lowpass filter and producing a variably clipped lowpass output signal;

c. a summing member having means for receiving and adding together said highpass output signal from said first differencer and said variably clipped lowpass output signal from said variable clipper and producing a summed output signal;

d. a fixed clipper having means for clipping said summed output signal from said summing member at a fixed threshold level and producing a clipped output signal;

e. an intermodulation detector including a second differencer, a switch, a rectifier and filter and a peak detector;

f. said peak detector coupled between said lowpass filter and said switch for detecting the amplitude of the bass frequency peaks in said unclipped input signal and producing a control pulse output signal for controlling said switch;

g. said second differencer having means for receiving said summed output signal from said summing member and said clipped output signal from said fixed clipper and producing a recovered peak clipped output signal corresponding to clipping of frequencies residing above a crossover frequency;

h. said switch connected between said second differencer and said rectifier and filter and controlled by said control pulse output signal of said peak detector, such that when said switch is in a closed condition, it allows said peak clipped output signal to flow through to said rectifier and filter to produce a D.C. voltage proportion to the amplitude of said recovered peak clipped output signal, and when said switch is in an opened condition, said rectifier and filter settles to zero; and i. said rectifier and filter coupled to said variable clipper such that an increasing D.C. output from said rectifier and filter causes a decreasing clip threshold of said variable clipper, but when said rectifier and filter is zero, the threshold of said variable clipper rests slightly below the threshold of said fixed clipper so as to prevent the additional clipping of low frequencies by said fixed clipper.

11. The split-band clipper in accordance with claim 10 wherein said (2N)th order lowpass filter includes two Nth order lowpass filters connected in series.

12. A split band clipper, comprising:
   a. a crossover means for receiving an unclipped input signal and splitting the unclipped input signal into a lowpass output signal and a highpass output signal;
   b. a variable clipping means for receiving said lowpass output signal from said crossover means and producing a variably clipped lowpass output signal;
   c. a summing means for receiving and adding together said highpass output signal from said crossover means and said variably clipped lowpass output signal of said variable clipping means and producing a summed output signal;
   d. a fixed clipper means for clipping said summed output signal from said summing means at a fixed threshold level and producing a clipped output signal;
   e. an intermodulation detector including a differencer, a switch, a rectifier and filter and a peak detector;
   f. said peak detector coupled between said crossover means and said switch for detecting the amplitude of the bass frequency peaks and producing a control pulse output signal for controlling said switch;
   g. said differencer for receiving said output signal from said summing means and said clipped output signal from said fixed clipper means and producing a recovered peak clipped output signal corresponding to clipping of frequencies residing above a crossover frequency;
   h. said switch connected between said differencer and said rectifier and filter and controlled by said control pulse of said peak detector, such that when said switch is in a closed condition, it allows said peak clipped output signal to flow through to said rectifier and filter to produce a D.C. voltage proportion to the amplitude of said recovered peak clipped output signal, and when said switch is in an opened condition, said rectifier and filter settles to zero; and
   i. said rectifier and filter coupled to said variable clipping means such that an increasing D.C. output from said rectifier and filter causes a decreasing clip threshold of said variable clipping means, but when said rectifier and filter is zero, the threshold of said variable clipping means rests slightly below the threshold of said fixed dipper means so as to prevent the additional clipping of low frequencies by said fixed clipper means.

13. The split-band clipper in accordance with claim 12 wherein said crossover means further includes an Nth order allpass filter, a (2N)th order lowpass filter and a differencer.

14. The split-band clipper in accordance with claim 13 wherein said (2N)th order lowpass filter includes two Nth order lowpass filters connected in series.

15. A split band clipper, comprising:
   a. a crossover means for splitting an input signal into a lowpass output signal and a highpass output signal;
   b. a variable clipping means for receiving said lowpass output signal from said crossover means and producing a variably clipped lowpass output signal;
   c. a summing means for receiving and adding together said highpass output signal from said crossover means and said variably clipped output signal from said variable clipping means and producing a summed output signal;
   d. a fixed clipper means for clipping said summed output signal from said summing means at a fixed threshold level;
   e. an intermodulation detector to measure the amount of high frequency clipping in said fixed clipper means caused by presence of low frequencies; and
   f. said intermodulation detector coupled to said variable clipping means to reduce the threshold of clipping of low frequencies by said variable clipping means whenever high frequency clipping is detected in said fixed clipper means as a result of the presence of low frequencies.

16. The split-band clipper in accordance with claim 15 wherein said crossover means further includes an Nth order allpass filter for receiving said unclipped input signal, a (2N)th order lowpass filter for receiving said unclipped input signal and a differencer.

17. The split-band clipper in accordance with claim 16 wherein said (2N)th order lowpass filter includes two Nth order lowpass filters connected in series.

18. The split-band clipper in accordance with claim 15 wherein said intermodulation detector further includes a differencer, a switch, a rectifier and filter, and a peak detector.

* * * * *